(12) United States Patent
Keupp et al.

(10) Patent No.: US 7,855,558 B2
(45) Date of Patent: Dec. 21, 2010

(54) MAGNETIC RESONANCE DEVICE AND METHOD

(75) Inventors: Jochem Keupp, Rosengarten (DE); Rolf Lamerichs, Sint Oedenrode (NL); Tobias Schaeffter, Blackheath (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 285 days.

(21) Appl. No.: 12/295,938

(22) PCT Filed: Mar. 30, 2007

(86) PCT No.: PCT/IB2007/051146

§ 371 (c)(1),
(2), (4) Date: Oct. 3, 2008

(87) PCT Pub. No.: WO2007/113759

PCT Pub. Date: Oct. 11, 2007

(65) Prior Publication Data

US 2010/0156415 A1  Jun. 24, 2010

(30) Foreign Application Priority Data

Apr. 6, 2006  (EP) .................................. 06112313

(51) Int. Cl.
 *G01V 3/00* (2006.01)
(52) U.S. Cl. ..................................... 324/307; 324/309
(58) Field of Classification Search ......... 324/300–322; 600/410–435
See application file for complete search history.

(56) References Cited

U.S. PATENT DOCUMENTS

| 4,585,992 | A | 4/1986 | Maudsley et al. |
| 5,528,145 | A | 6/1996 | Hirata et al. |
| 5,579,766 | A * | 12/1996 | Gray ........................... 600/407 |
| 5,767,676 | A * | 6/1998 | Schaffter et al. ............ 324/309 |
| 7,116,103 | B2 * | 10/2006 | Edwards et al. ............. 324/303 |
| 2003/0042904 | A1 | 3/2003 | Wiese et al. |
| 2004/0015075 | A1 * | 1/2004 | Kimchy et al. ............... 600/424 |
| 2005/0177042 | A1 | 8/2005 | Abe et al. |
| 2010/0119138 | A1 * | 5/2010 | Hulbert ....................... 382/131 |

OTHER PUBLICATIONS

Althaus, M., et al.; Fast 3D echo planar SSFP-based 1H spectroscopic imaging: demonstration on the rat brain in vivo; 2006; Magnetic Resonance Imaging; 24:549-555.

(Continued)

*Primary Examiner*—Melissa J Koval
*Assistant Examiner*—Dixomara Vargas

(57) ABSTRACT

MRI device arranged to a) generate a series of MR echo signals from a nuclear spin series having two or more spectral lines by subjecting at least part of a body (7) to an MR imaging pulse sequence using multiple time-encoding echo time values, b) acquire the MR echo signals for reconstructing a series of time-encoded MR images therefrom, each time-encoded MR image being associated with one of the time-encoding echo time values, c) transform the series of time-encoded MR images into a series of spectral domain MR images on a pixel-by-pixel or voxel-by-voxel basis, d) and superimpose the MR images for obtaining a final image the device being further arranged to apply a time-encoding scheme in step a) such that each spectral line of the nuclear spin species is uniquely mapped to one MR image from the series of spectral domain MR images.

10 Claims, 3 Drawing Sheets

OTHER PUBLICATIONS

An, L., et al.; Chemical Shift Imaging with Spectrum Modeling; 2001; Magnetic Resonance in Medicine; 46:126-130.

Boernert, P., et al.; Chemical-Shift-Sensitive NMR Imaging Using Adjusted Phase Encoding; 1990; J. of Magnetic Resonance; 87(2)220-229.

Glover, G. H., et al.; Three-Point Dixon Technique for True Water/Fat Decomposition with Bo Inhomogeneity Correction; 1991; Magnetic Resonance in Medicine; 18(2)371-383.

Lu, D., et al.; A matched Filter Echo Summation Technique for MRI; 1995; Magnetic Resonance Imaging; 13(2) 241-249.

McLean, M. A., et al.; Automated production of quantitative metabolite maps from short echo time 1H-CSI of the brain; 1998; Proc. Intl. Soc. Mag. Reson. Med.; p. 626.

Morawski, A. M., et al.; Quantitative "Magnetic Resonance Immunohistochemistry" with Ligand-Targeted 19F Nanoparticles; 2004; Magnetic Resonance in Medicine; 52:1255-1262.

Morikawa, S., et al.; Fast 13C-Glucose Metabolite Mapping in Rat Brain Using 1H Echo Planar Spectroscopic Imaging Technique; 2000; Proc. Intl. Soc. Mag. Reson. Med.; 8:1095.

Srinivasan, R., et al.; 2D Spectroscopic Imaging of Glutamate at 3T using TE-Averaged PRESS; 2005; Proc. Intl. Soc. Mag. Reson. Med.; 13:724.

Wild, J. M., et al.; In vivo lactate editing in single voxel proton spectroscopy and proton spectroscopic imaging by homonuclear polarisation transfer; 1998; Proc. Intl. Soc. Mag. Reson. Med.; p. 624.

* cited by examiner

MAGNETIC RESONANCE DEVICE AND METHOD

The invention relates to a device for magnetic resonance imaging of a body placed in an examination volume.

Furthermore, the invention relates to a method for MR imaging and to a computer program for an MR device.

In magnetic resonance imaging (MRI) pulse sequences including RF pulses and switched magnetic field gradients are applied to an object (a patient) placed in a homogeneous magnetic field within an examination volume of an MR device. In this way, phase encoded magnetic resonance signals are generated, which are scanned by means of RF receiving antennas in order to obtain information from the object and to reconstruct images thereof. Since its initial development, the number of clinically relevant fields of application of MRI has grown enormously. MRI can be applied to almost every part of the body, and it can be used to obtain information about a number of important functions of the human body. The pulse sequence, which is applied during an MRI scan, plays a significant role in the determination of the characteristics of the reconstructed image, such as location and orientation in the object, dimensions, resolution, signal-to-noise ratio, contrast, sensitivity for movements, et cetera. An operator of an MRI device has to choose the appropriate sequence and has to adjust and optimize its parameters for the respective application.

So-called molecular imaging and diagnostics (MID) is rapidly developing during the last years. MID is sometimes defined as the exploitation of specific molecules for image contrast and for diagnosis. This definition refers to the in-vivo measurement and characterization of cellular and molecular level processes in human subjects and to the analysis of biomolecules to screen, diagnose and monitor the human health status and to assess potential risks. An important prerequisite for molecular imaging is the ability to image molecular targets and gene expression.

At the moment, MR imaging is considered to be one of the most promising modalities in molecular imaging. Therefore, MR imaging is expected to play an essential role in the clinical use of MID for screening, targeted drug delivery and therapy evaluation. Highly sensitive contrast agents have recently been used to allow MR imaging of molecular targets and gene expression. As mentioned above, MRI can visualize the anatomy with good spatial resolution, is applicable to all body regions and will allow reproducible and quantitative imaging. It can also be used for intravascular and needle image-guided drug delivery. MR can partly assess molecular information, for example through spectroscopy.

It is important to note in this context that in particular $^{19}F$ MRI has a high potential in the field of MID and also in pharmaceutical research. $^{19}F$ MRI allows the direct quantification of nano particles, which can be used as contrast agents in MID, and of fluorinated (anti-cancer) drugs. However, $^{19}F$ MRI and contrast agent quantification is frequently complicated by strong chemical shift artefacts induced by multi-line spectra of the $^{19}F$ nuclear spins with a shift range of around 100 ppm. This problem equally occurs in MRI of other nuclei like $^{31}P$ or $^{23}Na$. There are many methods known in the art to deal with these problems, such as line saturation or line selection methods, chemical shift encoding techniques or certain deconvolution and iterative reconstruction methods. But these known methods typically lead to significantly reduced SNR (signal-to-noise ratio), significantly increased imaging time, and/or need complex and potentially unstable calculations during image reconstruction.

U.S. Pat. No. 5,528,145 discloses a high-speed spectroscopic MRI method. In this known method, magnetic resonance signals are generated and acquired by means of an imaging sequence using a time-encoding scheme with a series of equidistant echo time values. As a result, chemical shift spectra are obtained for each pixel or voxel of the reconstructed image. The measurement bandwidth of the known method is selected to be smaller than the maximum frequency difference between the lines in the spectrum of the nuclear species intended to be imaged. Aliasing effects are made use of in order to decrease the imaging time. Furthermore, setting of spatial resolution and spectral bandwidth independently is enabled by the known technique.

The known method relates to spectroscopic MRI—providing a full spectral information for each voxel or pixel location—but does not provide a solution regarding the above-mentioned MID-specific problems in connection with MRI of nuclei having strong chemical shifts. In MID, a single spin density image is typically required to assess local contrast agent concentrations. In a typical MID application using MRI, either the spectrum of the used contrast agent is previously known and invariant in all biologically relevant surroundings, or there is a previously known range of chemical shift changes (e.g. a line appearing or vanishing in case of a predefined physiological event). In contrast to the known method, an optimum SNR is required for MID applications in order to enable quantitative assessment of the distribution of a contrast agent in the examined body.

Therefore, it is readily appreciated that there is a need for an improved device for magnetic resonance imaging which provides maximum SNR for quantification of contrast agent distribution and which is time-efficient. It is consequently an object of the invention to provide an MR device that enables imaging with significantly reduced complications due to strong chemical shift artefacts. A further object of the invention is to provide an MR device, which is robust against possible system imperfections like $B_0$ inhomogeneity.

In accordance with the present invention, an MR device for magnetic resonance imaging of a body placed in an examination volume is disclosed, which comprises means for establishing a substantially homogeneous main magnetic field in the examination volume, means for generating switched magnetic field gradients superimposed upon the main magnetic field, means for radiating RF pulses towards the body, control means for controlling the generation of the magnetic field gradients and the RF pulses, means for receiving and sampling magnetic resonance signals, and reconstruction means for forming MR images from the signal samples. According to the invention, the device is arranged to a) generate a series of MR echo signals from a nuclear spin species having two or more spectral lines by subjecting at least a portion of the body to an MR imaging pulse sequence using multiple time-encoding echo time values, b) acquire the MR echo signals for reconstructing a series of time-encoded MR images therefrom, each time-encoded MR image being associated with one of the time-encoding echo time values, c) superimpose the MR images for obtaining a final image.

The MR device of the invention is arranged to acquire a series of MR images using a certain number of time-encoding echo time values. For image acquisition, the time-encoded MR signals may be recorded in separate scans, or multiple echoes of an echo-planar (EPI) sequence may be used. An essential feature of the invention is that the individual MR images from the image series, are superimposed, e.g. by computing the complex sum for each pixel or voxel. In this way, the SNR is maximized because all lines of the spectrum of the respective nuclear spin species are imaged simultaneously and contribute to the final image. The image intensity of the final MR image enables a reliable quantification of the contrast agent distribution in the examined body.

Preferably, the time-encoded images are transformed in the time-encoding direction for each pixel or voxel (e.g. by means of a conventional Fourier transformation) prior to step c) into a series of MR images in the spectral domain. A separation of the different spectral components of the imaged nuclear spin species is achieved in this way. It is possible to apply a time-encoding scheme in step a) such that each spectral line of the nuclear spin species is uniquely mapped to one MR image from the series of spectral domain MR images. The resulting image data set contains separate MR images for all individual spectral lines of the imaged nuclear spin species. Each intermediate spectral domain MR image exhibits a shift in position in the frequency encoding direction of the applied imaging pulse sequence according to the respective chemical shift value. This shift can be compensated for by performing a translation of each spectral domain MR image in the corresponding direction prior to superposition in step c). The translation distance is proportional to the frequency of the respective spectral line of the (known) spectrum of the imaged nuclear spin species. As a result, there are no shift artefacts in the final image after superposition of the spectral domain images. Before a complex superposition of the images, a phase correction can be applied using information from a one-time calibration measurement of the frequency response of the MR system.

In this context, it has to be noted that another important aspect of the invention is robustness against main magnetic field inhomogeneity of the MR device. This robustness is enabled by the pixel- or voxel-wise separation of spectral components. Even in cases of strong local inhomogeneities, the distribution of spectral lines of the known spectrum of the imaged nuclear spin species on the spectral domain MR images allows to determine the local off-resonance. This off-resonance can be compensated for by a corresponding shift in the time-encoding direction.

In a practical embodiment of the invention, the series of time-encoded MR images is generated using multiple equidistant time-encoding echo time values. Preferably, a fast Fourier-transformation is applied for the generation of the spectral domain intermediate image series. The time-encoding increment can preferably be selected such that the spectral bandwidth of the acquisition is smaller than the maximum frequency difference between the spectral lines of the nuclear spin species. The number of encoding steps, which is necessary to cover the full chemical shift range, is minimized in this way by taking advantage of aliasing effects. Aliasing, which is commonly regarded as detrimental in spectroscopic imaging, helps to reduce the scan time in accordance with the present invention. As a result, the invention provides optimal SNR at minimum scan time and also effective chemical shift artefact removal. In order to make sure that the spectral lines of the nuclear spin species are mapped to the intermediate spectral domain MR image series without overlap, the number of time-encoding increments should be larger than or at least equal to the number of spectral lines in the known spectrum.

The device of the invention can further be arranged to compute changes in the chemical shift spectrum of the nuclear spin species from the acquired MR echo signals. In this way, spectroscopic information from the imaged nuclear spin species can be obtained for molecular imaging purposes, e.g. in order to track chemical shift changes, such like lines in the spectrum that are known to appear or vanish in case of particular physiological events.

The invention not only relates to a device but also to a method for magnetic resonance imaging of at least a portion of a body placed in an examination volume of an MR device. The method comprises the following steps:

a) generating a series of MR signals from a nuclear spin species having two or more spectral lines by subjecting at least a portion of the body to an MR imaging pulse sequence using multiple time-encoding echo time values, b) acquiring the MR echo signals for reconstructing a series of time-encoded MR images therefrom, each time-encoded MR image being associated with one of the time-encoding echo time values, c) superimpose the MR images for obtaining a final image.

A computer program adapted for carrying out the imaging procedure of the invention can advantageously be implemented on any common computer hardware, which is presently in clinical use for the control of magnetic resonance scanners. The computer program can be provided on suitable data carriers, such as CD-ROM or diskette. Alternatively, it can also be downloaded by a user from an Internet server.

The enclosed drawings disclose preferred embodiments of the present invention. It should be understood, however, that the drawings are designed for the purpose of illustration only and not as a definition of the limits of the invention. In the drawings FIG. 1 shows an MR scanner according to the invention;

Figure 1:
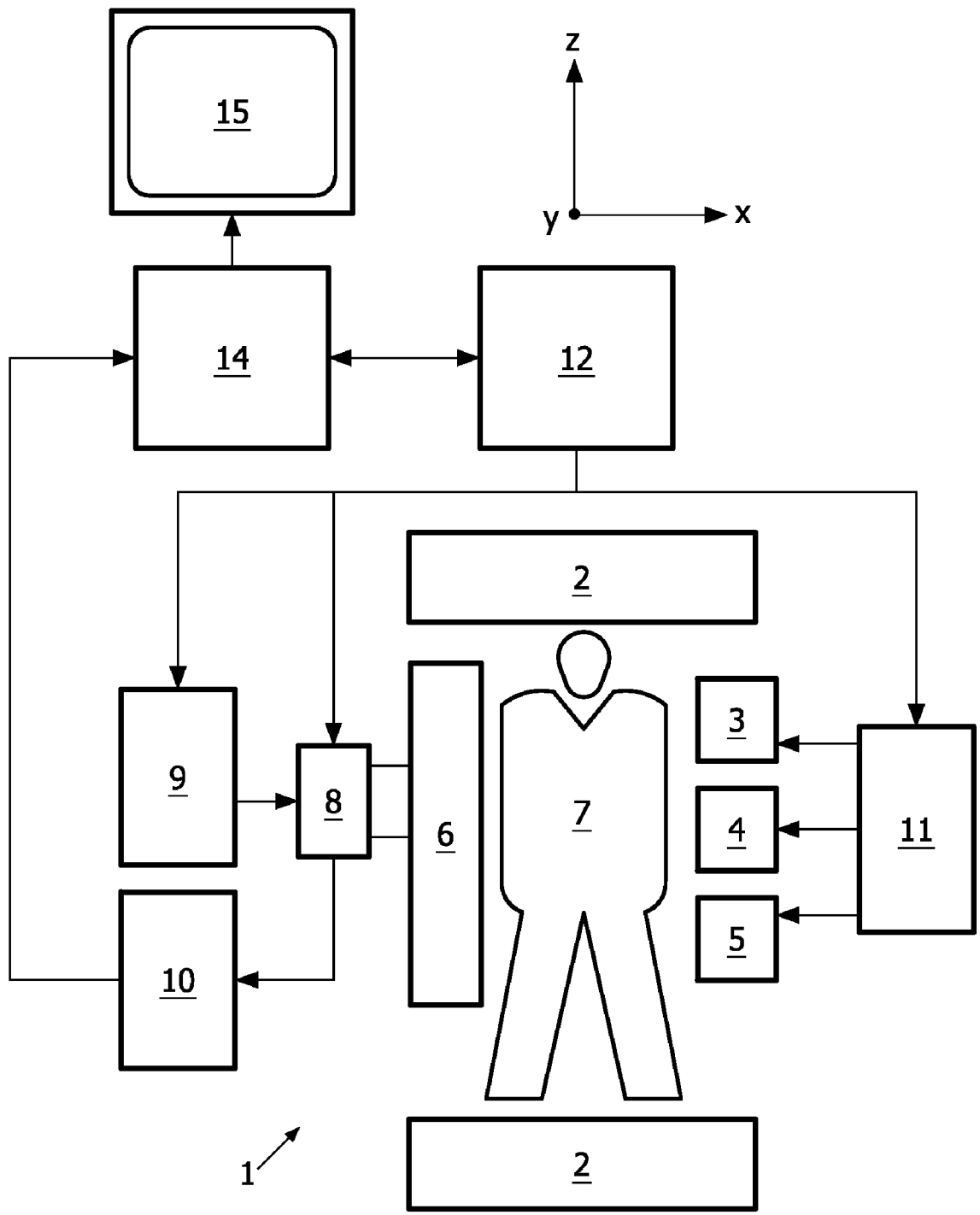

In FIG. 1 an MR imaging device 1 in accordance with the present invention is shown as a block diagram. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labeled the z-direction, the two directions perpendicular thereto the x- and y-directions. The gradient coils 3, 4 and 5 are energized via a power supply 11. The imaging device 1 further comprises an RF transmit antenna 6 for emitting radio frequency (RF) pulses to a body 7. The antenna 6 is coupled to a modulator 9 for generating and modulating the RF pulses. Also provided is a receiver for receiving the MR signals, the receiver can be identical to the transmit antenna 6 or be separate. If the transmit antenna 6 and receiver are physically the same antenna as shown in FIG. 1, a send-receive switch 8 is arranged to separate the received signals from the pulses to be emitted. The received MR signals are input to a demodulator 10. The send-receive switch 8, the modulator 9, and the power supply 11 for the gradient coils 3, 4 and 5 are controlled by a control system 12. Control system 12 controls the phases and amplitudes of the RF signals fed to the antenna 6. The control system 12 is usually a microcomputer with a memory and a program control. The demodulator 10 is coupled to reconstruction means 14, for example a computer, for transformation of the received signals into images that can be made visible, for example, on a visual display unit 15. For the practical implementation of the invention, the MR device 1 comprises a programming for carrying out the above-described method.

Figure 2:
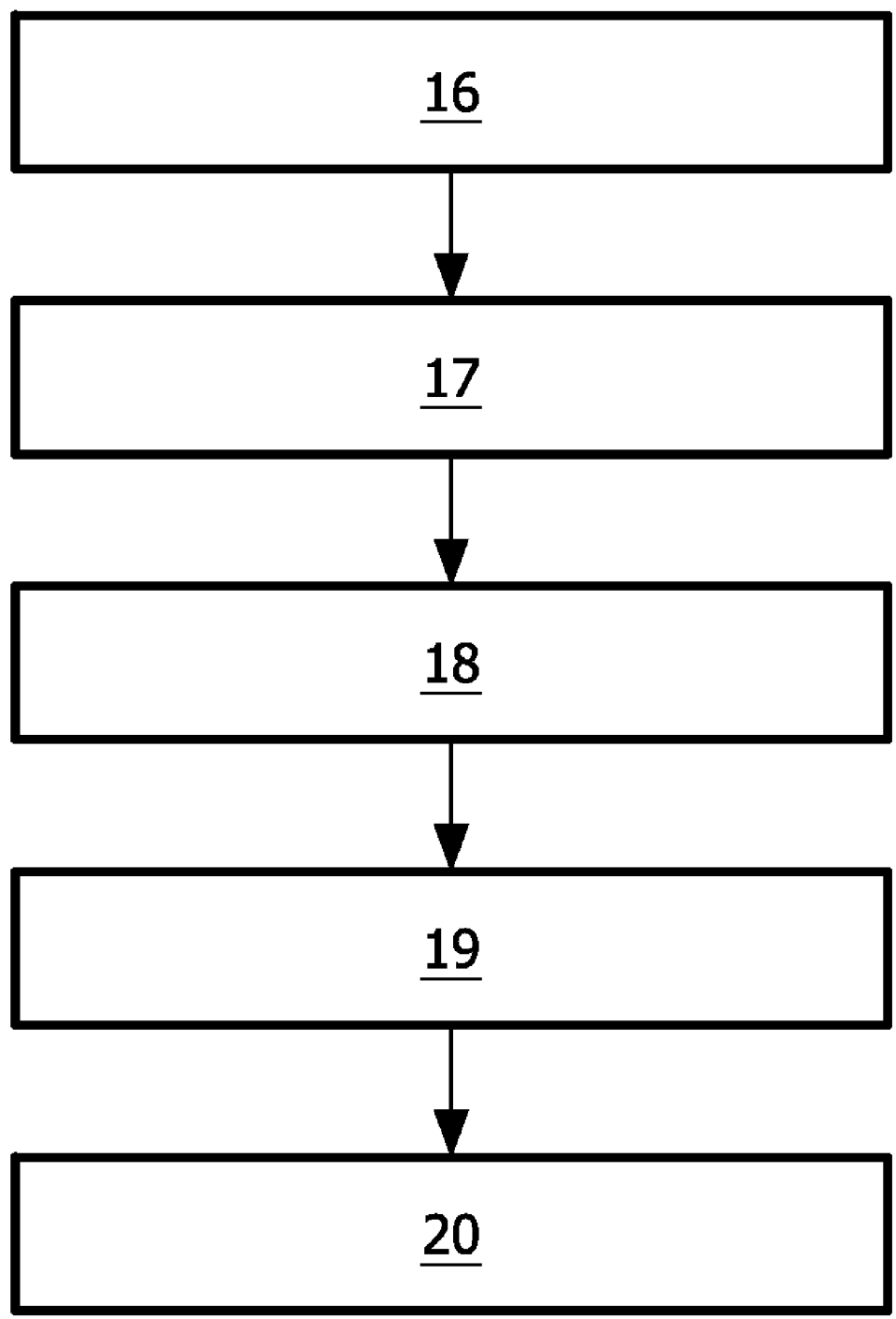
FIG. 2 shows a flow diagram of the method of the invention.
Figure 3:
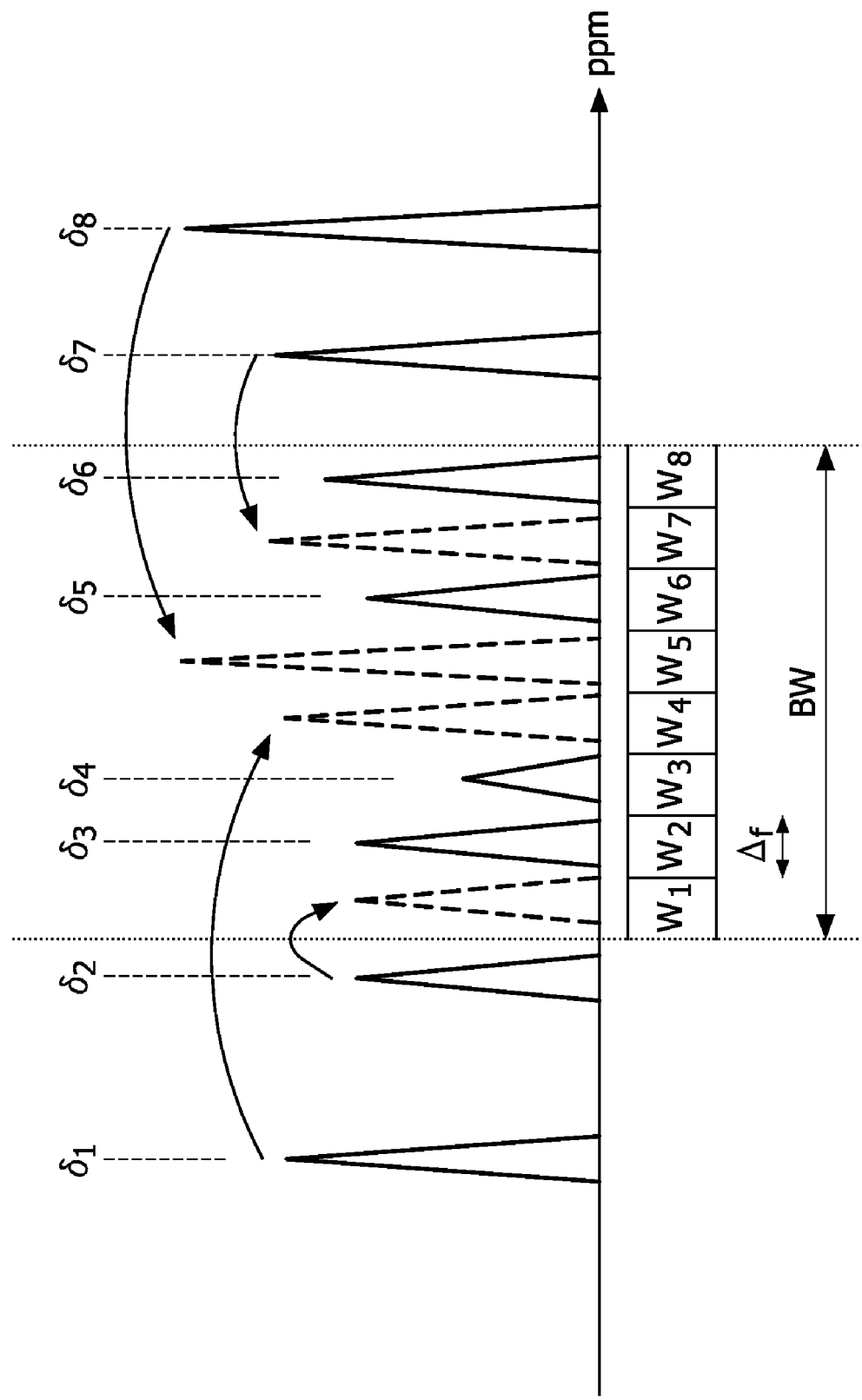
FIG. 3 shows a diagram illustrating the encoding scheme of the method of the invention.

FIG. 2 illustrates the method of the invention as a flow diagram. In a first step 16, the optimal spectral resolution and bandwidth for the acquisition of time-encoded MR images from a nuclear spin species having a known multi-line spectrum (e.g. the spectrum of a contrast agent containing $^{19}$F, $^{31}$P, or $^{23}$Na) is determined. A series of N time-encoded images is to be taken with N equidistant echo time values separated by an echo time increment $\Delta$TE. The spectral bandwidth BW is given by BW=1/$\Delta$TE, while the spectral resolution $\Delta$f is determined by $\Delta$f=1/(N$\Delta$TE). For a known MR spectrum of the imaged nuclear spin species, the spectral resolution $\Delta$f and bandwidth BW can be determined such that each resonance line coincides with one of the N spectral windows of the acquisition, as it is illustrated in FIG. 3. In accordance with the invention, the time-encoding increment $\Delta$TE can be selected such that the spectral bandwidth BW of the acquisition is smaller than the maximum frequency difference between the lines of the spectrum. In this case, aliasing occurs and the chemical shift components $\delta_i$ (i=1, 2, 3, ..., 8) outside the bandwidth BW are folded back into the encoded spectral region. The spectral resolution is tuned in step 16 so that each of these spectral lines is projected to an empty spectral window $W_i$ without overlapping other spectral components $\delta_i$. In an ideal case in terms of scan time, the number N of echo time increments equals the number of resonance lines. Therefore, no spectral window $W_i$ is acquired which contains only noise but no signal and, thus, an optimal encoding scheme is provided. It has to be noted that $T_2$ or $T_2^*$ relaxation at long time-encoding echo times is not detrimental, as long as the width $\Delta$f of a spectral window $W_i$ exceeds the line width of the individual spectral components. The line width (assuming a Lorentz line shape) is given by $1/(2\pi T_2^{(*)})$. In step 17, the actual acquisition and reconstruction of a series of N time-encoded MR images takes place using the time-encoding scheme determined in step 16. For image acquisition, a series of time-encoded MR echo signals is recorded in separate scans or multiple equidistant echoes of an echo-planar (EPI) sequence are used. Also in step 17, a pixel-wise Fourier transformation of the image data set in the time-encoding direction is performed. The resulting data set comprises a separate MR image for each line of the spectrum of the imaged nuclear species. Each of these images exhibits a shift in position along the frequency-encoding direction of the applied imaging pulse sequence. This chemical shift is compensated for in step 18 by a sub-pixel translation (e.g. by application of the Fourier-shift theorem) of each image in the corresponding direction. The translation distance $\Delta$ is given by $\Delta[\text{pixel}]=\delta_i/\text{PBW}$, wherein PBW is the pixel bandwidth of the image acquisition. After the alignment step 18, the images have to be rephased in step 19 because of phase differences given by the frequency response of the MR imaging system and parameters of the imaging pulse sequence. For a given MR apparatus and imaging sequence, the parameters for the phase correction are determined in a calibration scan. Finally, in step 20, the intermediate aligned MR images are superimposed by computation of the complex sum for each pixel or voxel. In the resulting final image, signal contributions from all spectral lines are summed up such that SNR is maximized. The intensity distribution in the final image enables the quantitative assessment of the distribution of the imaged nuclear spin species in the examined body, which is an important prerequisite e.g. for quantification of corresponding contrast agents in MID.

The invention claimed is:

1. A device for magnetic resonance imaging of a body placed in an examination volume, the device comprising
means for establishing a substantially homogeneous main magnetic field in the examination volume,
means for generating switched magnetic field gradients superimposed upon the main magnetic field,
means for radiating RF pulses towards the body,
control means for controlling the generation of the magnetic field gradients and the RF pulses,
means for receiving and sampling magnetic resonance signals, and
reconstruction means for forming MR images from the signal samples, the device being arranged to
a) generate a series of multiple frequency-encoded MR echo signals from a nuclear spin species having a known multi-line spectrum by subjecting at least a portion of the body to an MR imaging pulse sequence using multiple incremental time-encoding echo time values,
b) acquire the MR echo signals for reconstructing a series of time-encoded MR images therefrom, wherein one time-encoded MR image is reconstructed for each time-encoding echo time values,
c) transform the series of time-encoded MR images into a series of spectral domain MR images on a pixel-by-pixel or voxel-by-voxel basis by applying a Fourier transformation in the time-encoding direction such that the resulting series of spectral domain MR images contains a separate MR image for each spectral line of the multi-line spectrum,
wherein the device is further arranged to translate each image from the series of spectral domain MR images in the frequency-encoding direction by a translation distance being proportional to the frequency of the respective spectral line and to superimpose the MR images to obtain a final image by computing the pixel-or-voxel-wise sum of the MR images from the series of spectral domain MR images.

2. The device of claim 1, wherein the device is arranged to apply a time-encoding scheme in step a) such that each spectral line of the nuclear spin species is uniquely mapped to one MR image from the series of spectral domain MR images.

3. The device of claim 1, wherein the device is further arranged to generate the series of time-encoded MR images using multiple equidistant time-encoding echo time values.

4. The device of claim 3, wherein the device is further arranged to compute a time-encoding increment such that the spectral bandwidth of the acquisition is smaller than the maximum frequency difference between the spectral lines of the nuclear spin species.

5. The device of claim 3, wherein the device is further arranged to apply a number of time-encoding increments being larger than or equal to the number of spectral lines of the nuclear spin species.

6. The device of claim 5, wherein the device is arranged to compute changes in the chemical shift spectrum of the nuclear spin species from the acquired MR echo signals.

7. A method for MR imaging of at least a portion of a body placed in an examination volume of an MR device, the method comprising the following steps:
a) generating a series of multiple frequency-encoded MR signals from a nuclear spin species having a known multi-line spectrum by subjecting at least a portion of the body to an MR imaging pulse sequence using multiple incremental time-encoding echo time values,
b) acquiring the MR echo signals for reconstructing a series of time-encoded MR images therefrom, wherein one time-encoded MR image is reconstructed for each time-encoding echo time values,
c) transforming the series of time-encoded MR images into a series of spectral domain MR images on a pixel-by-pixel or voxel-by-voxel basis by applying a Fourier transformation in the time-encoding direction such that the resulting series of spectral domain MR images contains a separate MR image for each spectral line of the multi-line spectrum, wherein each image from the series of spectral domain MR images is translated in the frequency-encoding direction by a translation distance being proportional to the frequency of the respective spectral line, wherein the MR images are superimposed to obtain a final image by computing the pixel- or voxel-wise sum of the MR images from the series of spectral domain MR images.

8. The method of claim 7, wherein a time-encoding scheme is applied in step a) such that each spectral line of the nuclear spin species is uniquely mapped to one MR image from the series of spectral domain MR images.

9. The method of claim 7, wherein the series of time-encoded MR images is generated using multiple equidistant time-encoding echo time values, the time-encoding increment being selected such that the bandwidth of the acquisition is smaller than the maximum frequency difference between the spectral lines of the nuclear spin species, and the number of time-encoding increments is larger than or equal to the number of spectral lines of the nuclear spin species.

10. A computer program for an MR device, comprising instructions for:

a) generating an MR imaging pulse sequence using multiple incremental time-encoding echo time values, b) acquiring time-encoded MR echo signals for reconstructing a series of time-encoded MR images therefrom, wherein one time-encoded MR image is reconstructed for each time-encoding echo time value, c) transforming the series of time-encoded MR images into a series of spectral domain MR images on a pixel-by-pixel or voxel-by-voxel basis by applying a Fourier transformation in the time-encoding direction such that the resulting series of spectral domain MR images contains a separate MR image for each spectral line of the multi-line spectrum, comprising instructions for translating each image from the series of spectral domain MR images in the frequency-encoding direction by a translation distance being proportional to the frequency of the respective spectral line and to superimpose the MR images to obtain a final image by computing the pixel- or voxel-wise sum of the MR images from the series of spectral domain MR images.

* * * * *